(12) United States Patent
Lin

(10) Patent No.: US 7,095,188 B1
(45) Date of Patent: Aug. 22, 2006

(54) SERIAL FAN SET AND ROTATION SPEED-MATCHING CURVE GENERATION METHOD THEREOF

(75) Inventor: Shu-Ju Lin, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/075,856

(22) Filed: Mar. 10, 2005

(51) Int. Cl.
*H02P 5/00* (2006.01)
*H02P 5/46* (2006.01)

(52) U.S. Cl. ............ 318/66; 318/63; 318/64; 318/56; 318/55; 318/101; 318/254; 318/268; 388/800; 388/825

(58) Field of Classification Search .......... 318/59, 318/64, 66, 101, 268, 138, 254, 439, 34, 318/77, 78
See application file for complete search history.

(56) References Cited

U.S. PATENT DOCUMENTS

| | | | | |
|---|---|---|---|---|
| 3,334,807 A | * | 8/1967 | McMahan | 415/207 |
| 4,158,527 A | * | 6/1979 | Burkett | 417/18 |
| 4,225,289 A | * | 9/1980 | Burkett | 417/3 |
| 4,651,922 A | * | 3/1987 | Noba | 236/35 |
| 4,797,600 A | * | 1/1989 | Savage et al. | 318/254 |
| 4,988,930 A | * | 1/1991 | Oberheide | 318/82 |
| 5,019,757 A | * | 5/1991 | Beifus | 318/254 |
| 5,249,741 A | * | 10/1993 | Bistline et al. | 236/49.3 |
| 5,557,182 A | * | 9/1996 | Hollenbeck et al. | 318/432 |
| 6,368,064 B1 | * | 4/2002 | Bendikas et al. | 417/2 |
| 6,396,688 B1 | * | 5/2002 | Davies et al. | 361/687 |
| 6,400,113 B1 | * | 6/2002 | Garcia et al. | 318/463 |
| 6,445,148 B1 | * | 9/2002 | Huang et al. | 318/34 |
| 6,748,162 B1 | * | 6/2004 | Poutot et al. | 388/800 |
| 6,809,484 B1 | * | 10/2004 | Makaran et al. | 318/34 |
| 6,933,687 B1 | * | 8/2005 | Makaran et al. | 318/34 |
| 6,935,130 B1 | * | 8/2005 | Cheng et al. | 62/259.2 |

FOREIGN PATENT DOCUMENTS

JP 05-68392 * 3/1993

* cited by examiner

*Primary Examiner*—Rina Duda
*Assistant Examiner*—Tyrone Smith
(74) *Attorney, Agent, or Firm*—Harness, Dickey & Pierce, PLC

(57) ABSTRACT

A serial fan set and rotation speed-matching curve generation method thereof are provided. The serial fan set comprises a rotation speed control module, a first fan and a second fan, in which the rotation speed control module is used to receive the power signal and produce the rotation speed driving signal corresponding to the power signal in accordance with the relations of the rotation speed-matching curve, so that the first fan and the second fan are operated at the matching rotation speed, thus producing the optimum operation efficiency and achieving the purpose of controlling the serial fan set.

7 Claims, 7 Drawing Sheets

| sequential number | first fan rotation speed (rpm) | second fan rotation speed (rpm) |
|---|---|---|
| 1 | 1200 | 800 |
| 2 | 1100 | 900 |
| 3 | 1000 | 1000 |
| 4 | 900 | 1100 |
| 5 | 800 | 1200 |

FIG.3

SERIAL FAN SET AND ROTATION SPEED-MATCHING CURVE GENERATION METHOD THEREOF

BACKGROUND OF THE INVENTION

1. Field of the Invention

The invention relates to a fan set and rotation speed-matching curve generation method for controlling the fan set, especially to a serial fan set operated in accordance with its rotation speed-matching characteristic curve and the method of generating, such as a rotation speed-matching curve.

2. Related Art

With the increasing operation speed of the central processing unit (CPU) and the rising demand for reducing the unit area used for circuit design, a data processing device is in need of a better heat dissipation system to enhance the stability of system operation. The serial fan set system of the invention is designed to provide fairly good heat dissipation efficiency, as such it is frequently utilized in the data processing device, requiring high heat dissipation efficiency.

The serial fan set is composed of two fans, arranged closely in sequence having mutually reverse fan rotation directions (one rotates in the forward direction, and the other rotates in the reverse direction), thus increasing the output air volume and air pressure, and improving the fan rotation efficiency.

In general, since the respective fan of the serial fan set system receives the same input voltage, as such in controlling the fan rotation speed, the input voltage of the two fans must be controlled simultaneously to control their rotation speed. However, by doing so, it would lead to the result that the two fans are capable of producing the optimized rotation speed, matching only when they are operated under the maximum operation voltage, yet when the system is operated in the range between the minimum operation speed and the maximum operation speed, the rotation speed-matching and operation efficiency of the serial fan set system are not quite satisfactory.

As the serial fan set system has to be operated with specific rotation speed ratio (since its rotation directions are mutually reverse, the rotation speeds of the two fans affect each other), and the rotation speed ratio at the respective rotation speed operation point is not quite the same, as such the operation of the serial fan set can not be maintained with optimum efficiency in the ordinary fan set control method of the prior art.

Therefore, how to achieve the optimum rotation speed-matching in the operation range of the serial fan set, is the most important problem to be solved, so as to achieve a breakthrough in this field.

SUMMARY OF THE INVENTION

In view of the above-mentioned shortcomings and drawbacks of the prior art, the invention provides a serial fan set and a rotation speed-matching curve generation method. Wherein the operation of the fan set is based on the previously acquired fan rotation speed-matching curve, thus solving the problem of the rotation speed control of the serial fan set in its entire operation range.

To achieve the above-mentioned objective, the invention provides a serial fan set, comprising: a rotation speed control module, a first fan, and a second fan, wherein the rotation speed control module has a characteristic circuit, which is used to receive the power signal and the output rotation speed driving signal in accordance with the rotation speed-matching curve; a first fan, used to receive the power signal and operate with a corresponding rotation speed; a second fan, used to receive the rotation speed driving signal and generate the matched rotation speed.

In addition, in order to achieve the above-mentioned objective, the invention further provides a serial fan set, comprising: a rotation speed control module, a first fan, and a second fan, wherein the rotation speed control module has a characteristic circuit, which is used to receive external input according system-level demand, and provide correspond driving signals to target fan or fans; the first fan, used to receive the driving signal and operate with a corresponding rotation speed; a second fan, used to receive the rotation speed driving signal and generate the matched rotation speed.

Furthermore, the invention provides a rotation speed-matching curve generation method for the serial fan set, comprising the following steps: setting a plurality of sets of rotation speed values to be measured, namely adjusting the range of the rotation speed value of the second fan, based on the rotation speed value of the first fan, or adjusting the range of the rotation speed value of the first fan, based on the rotation speed value of the second fan, to obtain a plurality of sets of set rotation speed; operating the serial fan set in accordance with a plurality of sets of set rotation speed, so as to obtain a plurality of air pressure vs air flow characteristic curves; determining the local optimum value of the air pressure and air flow; plotting the rotation speed-matching curve of the serial air set by making use of the first fan and second fan rotation speed values, corresponding to the respective local optimum value.

Through the application and implementation of the serial fan set and the rotation speed-matching curve generation method, the rotation speed of the serial fan set can be kept at its optimized matching condition in the entire operation range, thus solving the problem and shortcoming of the prior art that the rotation speed of the serial fan set can not be controlled while achieving the rotation speed-matching in accordance with the input voltage.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The above objects and advantages of the invention will become more apparent with the following detailed description of the exemplary embodiments thereof with reference to the attached drawings in which:

FIG. 3 is a table of rotation speed settings of the serial fan set of the invention;

DETAILED DESCRIPTION OF THE INVENTION

Figure 1A:
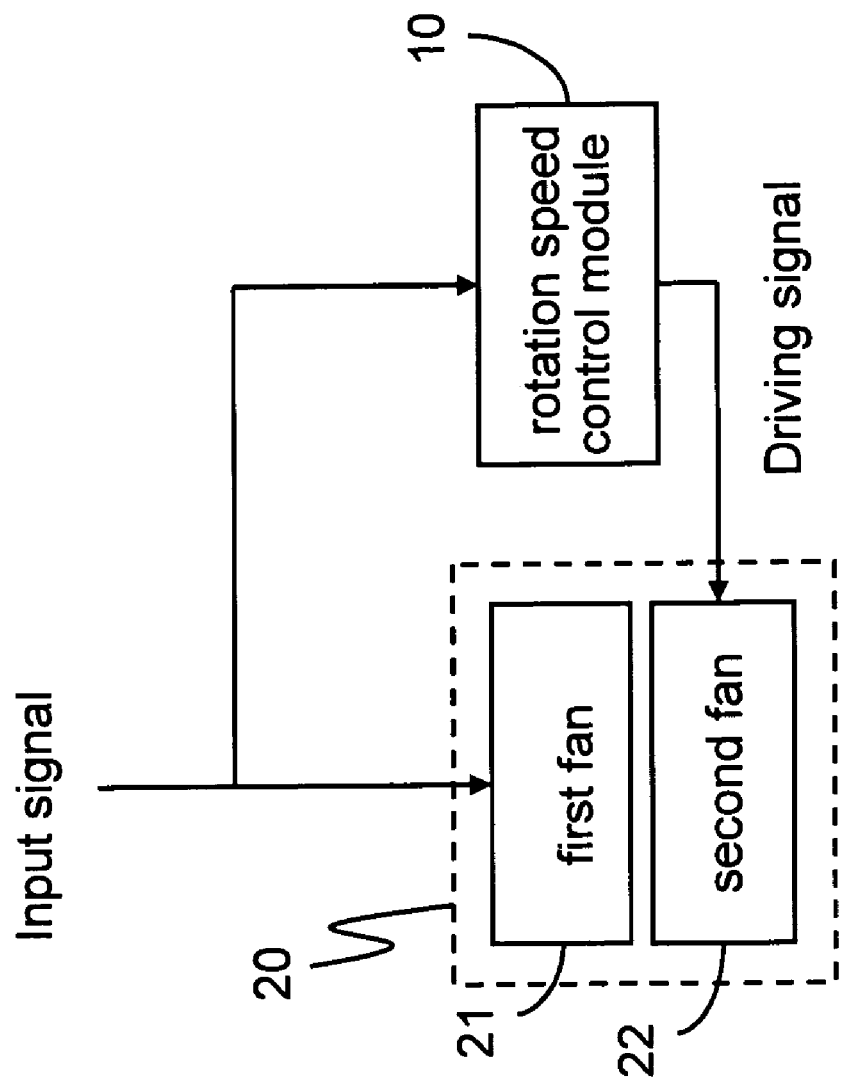
FIG. 1A is a system block diagram of the serial fan set according to the first embodiment of the invention.

Refer to FIG. 1A, which shows the system block diagram according to the first embodiment of the invention, comprising: a rotation speed control module 10, a first fan 21 and a second fan 22.

The rotation speed control module 10, provided with a characteristic circuit having the functions of the rotation speeds matching, is used to receive input signal and output the corresponding rotation speed driving signals in accordance with the matching relations of the rotation speed-matching curve of the characteristic circuit, so that the rotation speed of the first fan 21 matches that of second fan 22, wherein the rotation speed control module 10 can be installed in the fan or on the main machine board (not shown).

The first fan 21 and rotational speed control module are received the input signal. The second fan 22 is received the driving signal by the rotation speed control module 10 so as to generate the corresponding rotation speed. The input and driving signal may be a voltage level or certain width duration from PWM generator.

Therefore, when the input signal is varied, the rotation speed of the first fan 21 is varied. The second fan 22 receives the driving signal by the rotation speed control module 10 to generate its own corresponding rotation speed, as such the rotation speeds of the first fan 21 and the second fans 22 are kept and maintained according to the matching relations provided by the rotation speed-matching characteristic curve.

In addition, when the number of fans of the serial fan set 20 exceeds 2, the rotation speed control module 10 may be so designed and configured according to the number of fans, that each rotation speed control module 10 corresponds to an fan, thus achieving the optimum operation of the serial fan 20 with the optimum Air Pressure and Air Flow in the entire operation range of the fans.

Figure 1B:
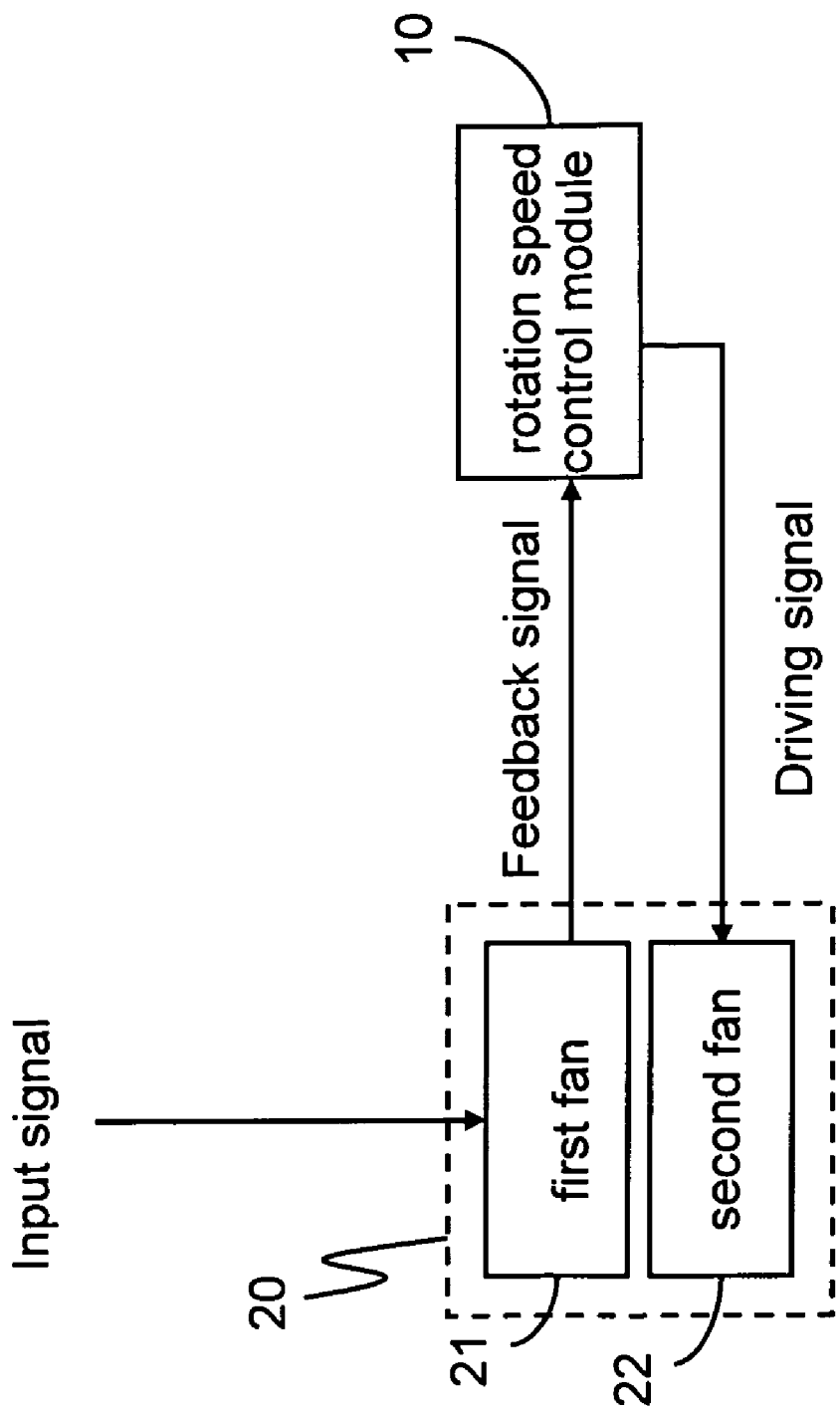
FIG. 1B is a system block diagram of the serial fan set according to the second embodiment of the invention.

FIG. 1B exhibits the second embodiment of this invention. The first fan 21 not only receive input signal, but also provide a feedback signal to control module 10. According to speed-matching characteristic chart, the control module 10 converts feedback signal into the driving signal for the second fan. With this mechanism, both fans are able to operate as the behavior of speed-matching characteristic curve when input signal is varied.

Figure 1C:
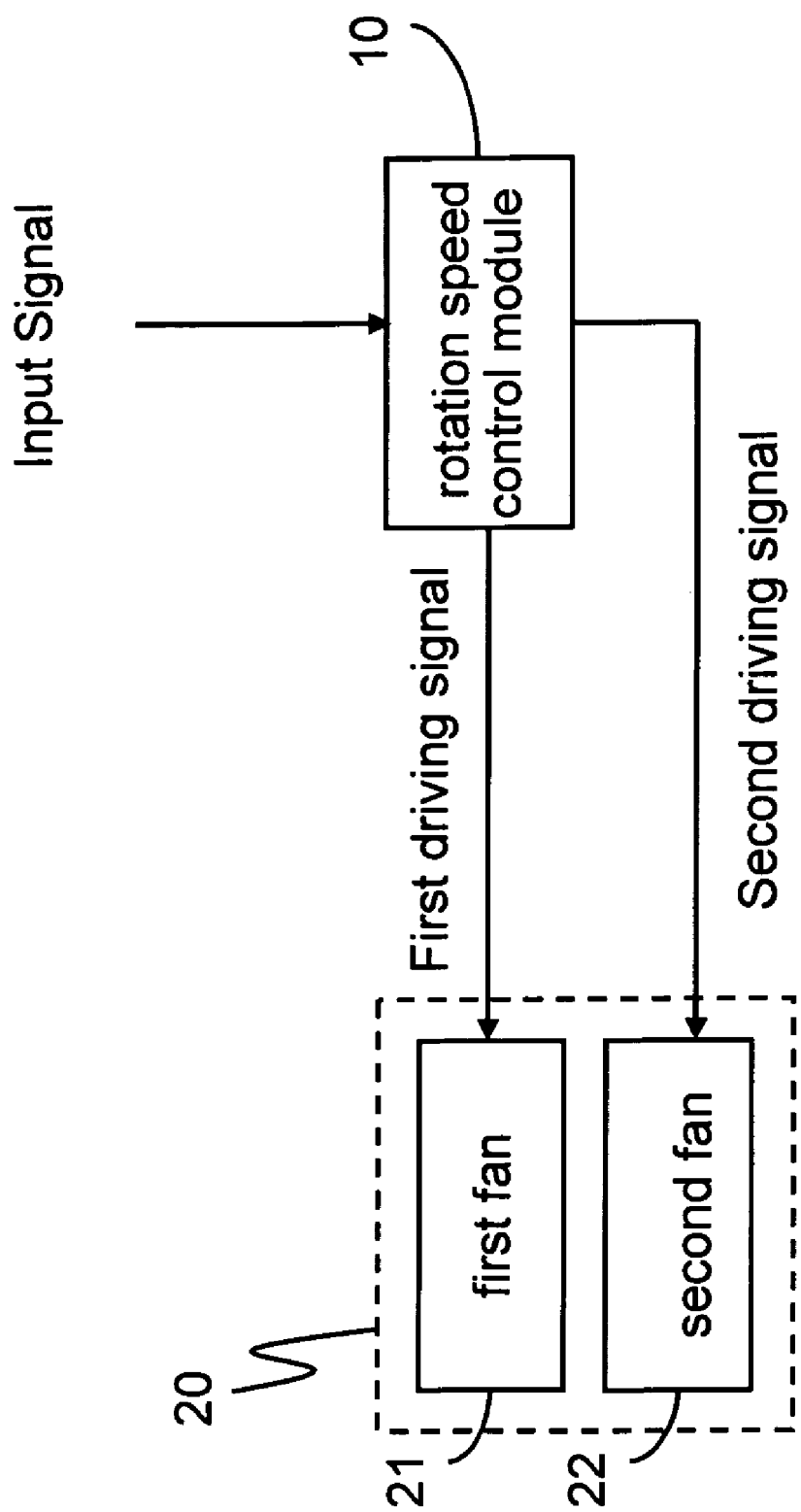
FIG. 1C is a system block diagram of the serial fan set according to the third embodiment of the invention.

The third embodiment of this invention is shown as FIG. 1C The block diagram of the serial fans comprises a rotation speed control module 10, a first fan 21 and a second fan 22.

The difference between the second embodiment and the first embodiment is that: in the third embodiment the rotation speed control module 10 does not need the feedback signal from the first fan 21 to control the rotation speed of the second fan 22, instead the first fan 21 first driving signal and second fan 22 second driving signal are generated by the rotation speed control module 10, so that the first fan 21 and the second fan 22 rotate according to the matching relations provided by the rotation speeds matching the characteristic curve. The operation principle of the remaining portion of the circuit is the same as that of the first embodiment, and it will not be repeated here for brevity's sake.

Figure 2:
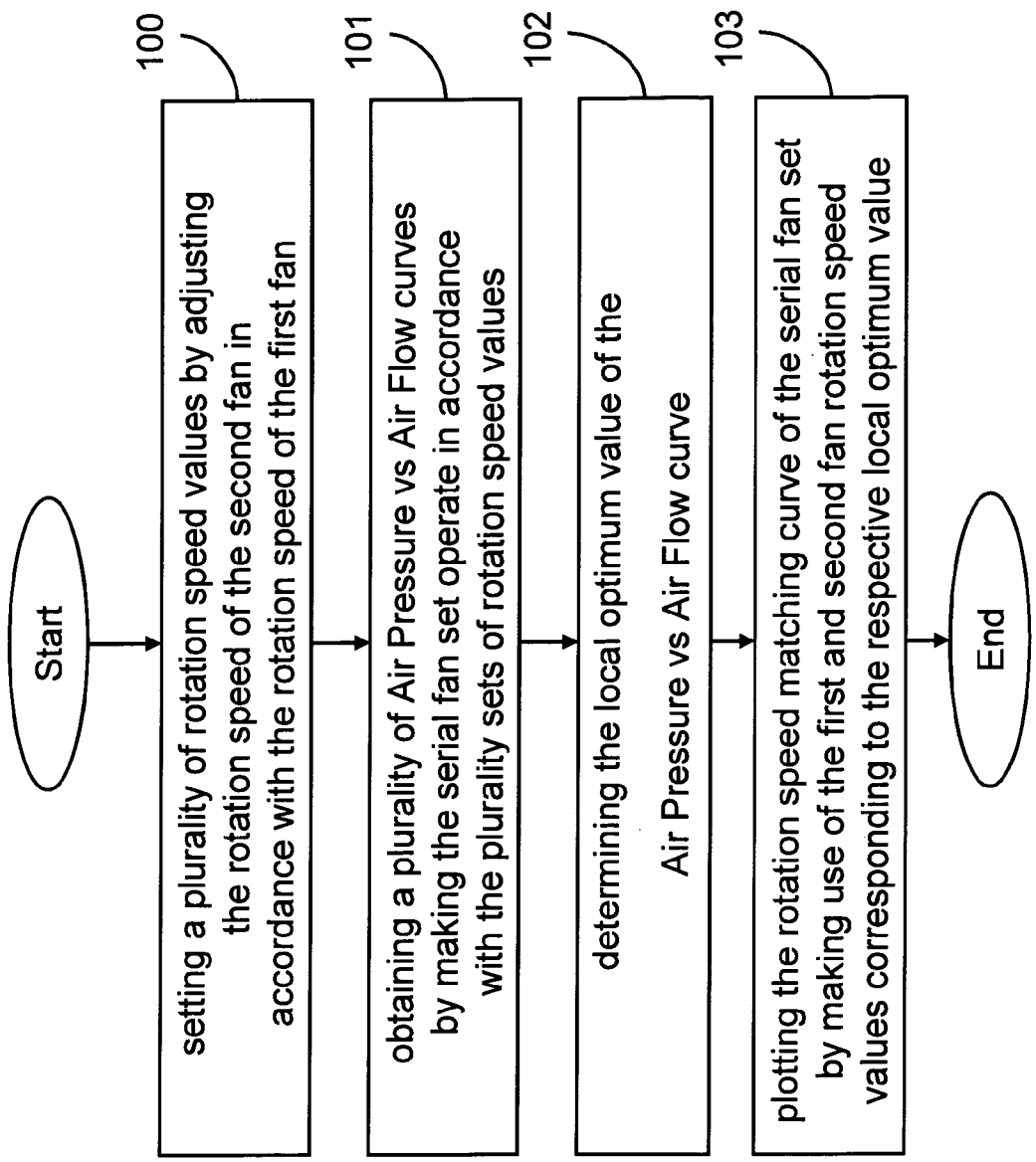
FIG. 2 is a flowchart of the operation of the serial fan set according to the embodiment of the invention.

Refer to FIG. 2, which shows the flowchart of the steps for generating the rotation speed-matching the characteristic curve. First, setting the plurality of sets of rotation speed to be measured (step 100), namely, adjusting the range of rotation speed values of the second fan based on the rotation speed values of the first fan, to obtain a plurality of sets of rotation speed values, or adjusting the range of rotation speed values of the first fan, based on the rotation speed values of the second fan, to obtain a plurality of sets of rotation speeds, so that the serial fan set rotates according to each of the plurality of sets of preset rotation speed values, and thus obtaining a plurality of Air Pressure vs. Air Flow characteristic curves (step 101).

Subsequently, determining the local optimum value on the Air Pressure vs. Air Flow characteristic curves, based on the operation requirements (step 102). Then, plotting the rotation speed-matching curve of the serial fan according to the first and second fan rotation speed corresponding to the local optimum value (step 103).

Figure 4:
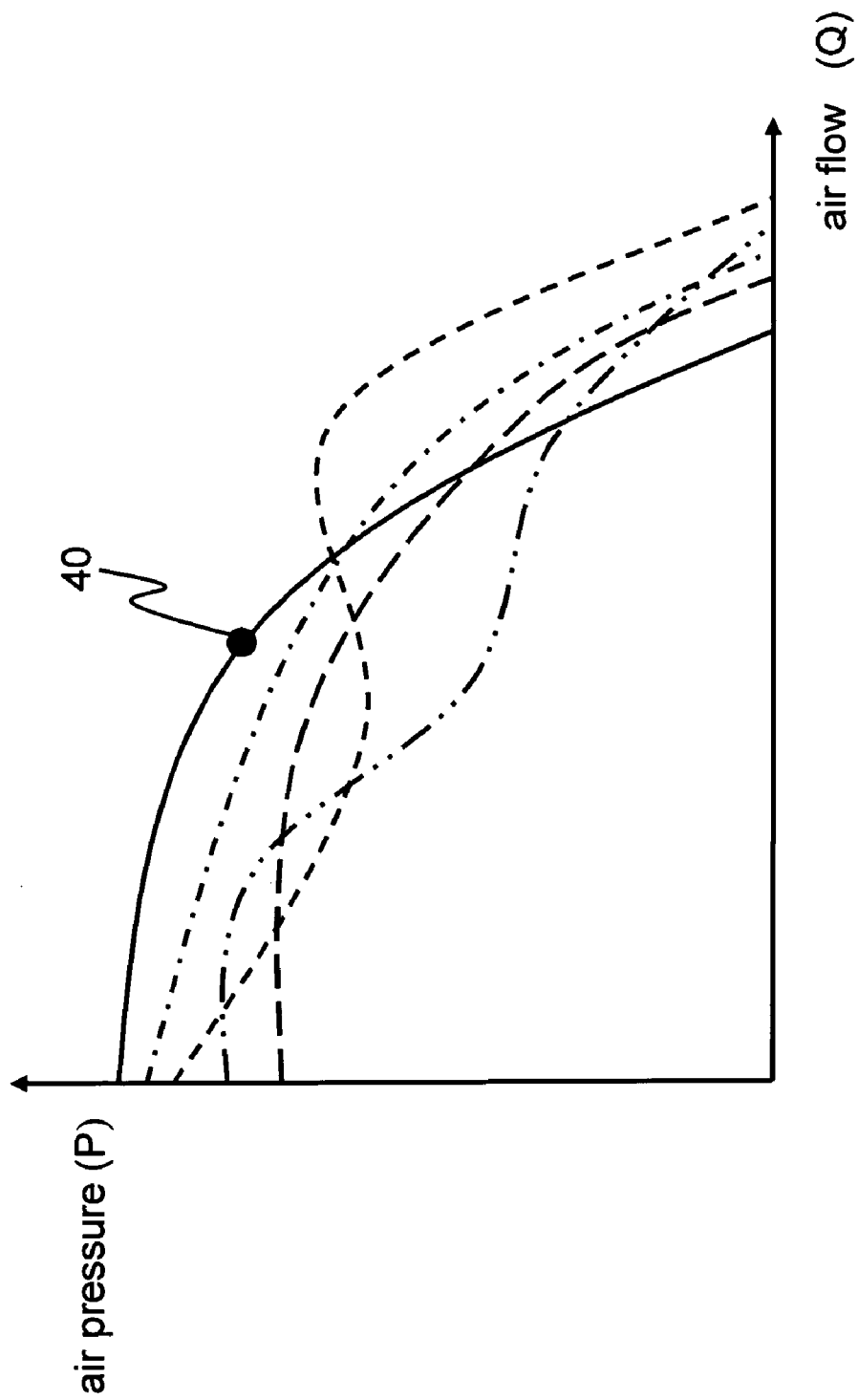
FIG. 4 is a diagram indicating the curve of air pressure vs air flow (P-Q) of the serial fan set of the invention.

Refer to FIG. 3, which shows the rotation speed setting values table of the serial fan set of the invention. The values in the table is obtained by fixing the rotation speed of the first fan 21, and adjusting the rotation speed of the second fan 22. When the rotation speed of the first fan 21 is set at 1000 revolutions per minute (rpm), adjusting the rotation speed of the second fan 22 from 800 rpm to 1200 rpm, thus generating 5 sets of rotation speeds (the purpose of making use of 5 sets of rotation speeds is for illustration only), then test-run the serial fan set by making use of the 5 sets of rotation speed values to obtain the 5 corresponding Air Pressure vs Air Flow (R-Q) curve as shown in FIG. 4.

Figure 5:
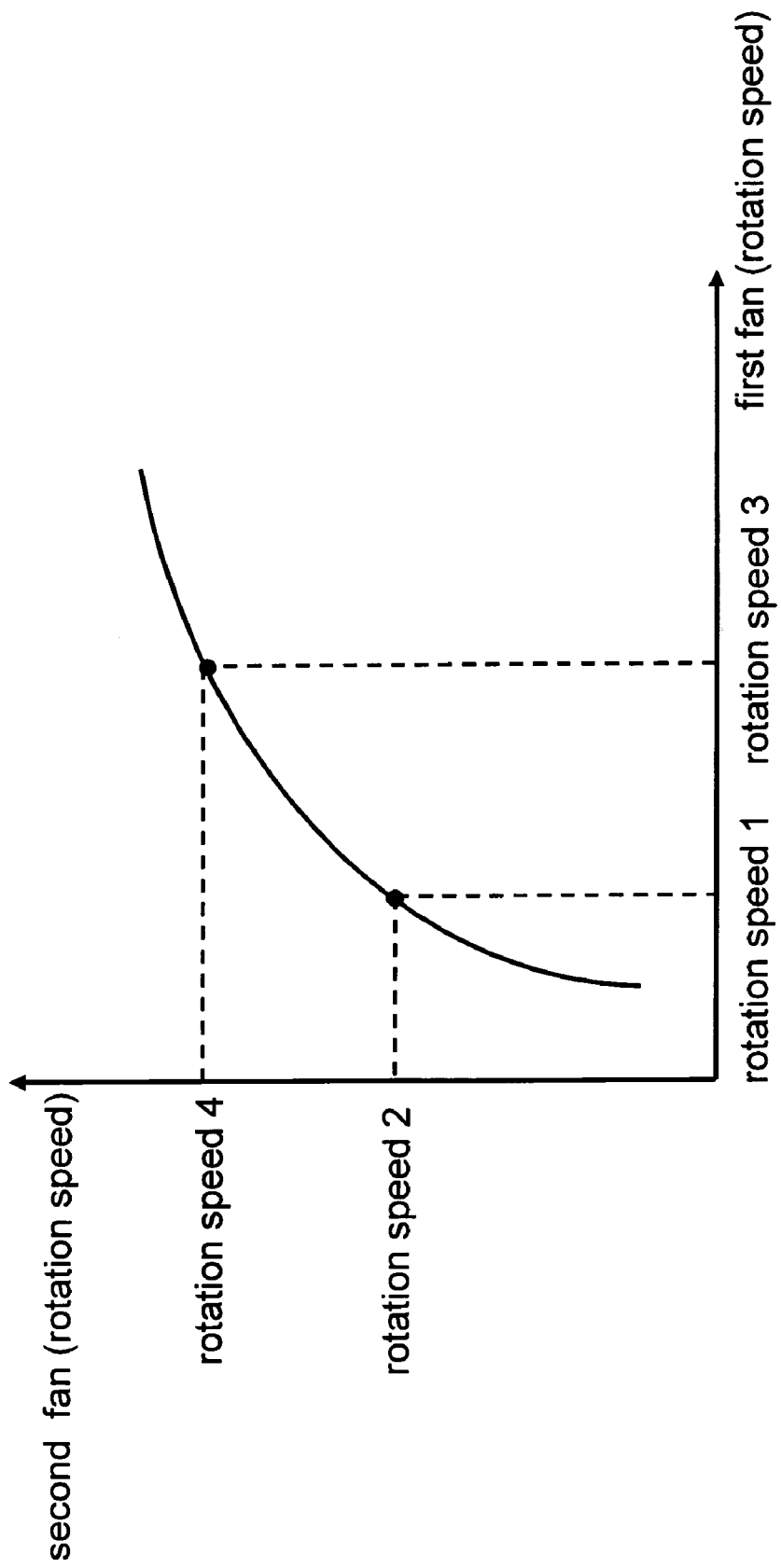
FIG. 5 is a diagram indicating the curve of the rotation speed-matching between two fans of the invention.

Then, the local optimum value 40 is determined by selecting the Air Pressure and Air Flow (P-Q) curve, required according to the requirement of the fan operation conditions (for example, high or low rotation speed), and then obtaining the corresponding fan rotation speed value according to this local optimum value 40 determined. Thus the local optimum values of the entire operation range are obtained by respectively varying the set rotation speed value and conducting the respective test-run, then plotting a rotation speed-matching curve, based on the rotation speed value corresponding to each local optimum value as shown in FIG. 5. Finally, the fans of the serial fan set are operated with the matching rotation speeds according to the driving signals of the first fan 21 and the second fan 22, output by the rotation speed control module 10, based on the rotation speeds matching the characteristic curve.

Refer to FIG. 5, which shows the diagram illustrating the rotation speed-matching curve between the respective fans. This rotation speed-matching curve is obtained by plotting the rotation speed value corresponding to the local optimum value of the Air Pressure vs Air Flow curve of FIG. 4, with its horizontal axis as the rotation speed of the first fan 21, and its vertical axis as the rotation speed of second fan 22. When the rotation speed of the first fan 21 is rotation speed 1, it corresponds to the rotation speed 2 of the second fan 22 on the said rotation speed-matching curve, and at this particular point on the curve, the first fan 21 and the second fan 22 operated with rotation speed 1 and rotation speed 2 produce the optimized Air Pressure vs Air Flow performance; when the rotation speed of the first fan 21 is increased to rotation speed 3, it corresponds to the increased rotation speed 4 of the second fan 22 on the said rotation speed-matching curve. At this particular point on the curve, the first fan 21 and the second fan 22 with rotation speed 3 and rotation speed 4 produce another optimized Air Pressure vs Air Flow performance. Thus, the corresponding relations of the rotation speed-matching curve is obtained by making use of the "trial-and-error" method in getting the rotation speed-matching relations between the first fan 21 and the second fan 22, and the characteristic circuit is utilized to realize the corresponding relations in the above-mentioned curve.

When the number of fans of the serial fan set exceeds two, the rotation speed-matching curve may also obtained by making use of the above-mentioned method, thus acquiring the information concerning the corresponding relations of the rotation speed of the respective set of fans. As such, the rotation speeds of the respective fans of the serial fan set are controlled through the rotation speed control module, so that the serial fan set can be operated with the optimum efficiency in its entire operation range.

Through the application and implementation of this particular pre-set rotation speed-matching curve, the first fan and second fan of the serial fan set can be controlled to operate with optimum operation efficiency in its entire range of operation, thus achieving the purpose of controlling the rotation efficiency of the serial fan set and improving its heat dissipation efficiency.

While the invention has been shown and described with reference to preferred embodiments thereof, it will be understood by those skilled in the art that various changes in form and details may be made therein without departing from the spirit and scope of the invention as defined by the appended claims.

What is claimed is:

1. A serial fan set, comprising:
    a rotation speed control module, which is used to receive an input signal, and output a rotation speed driving signal corresponding to the input signal in accordance with the rotation speed-matching relations of a rotation speed-matching curve;
    a first fan, connected to the rotation speed control module and rotating at a corresponding rotation speed; and
    a second fan, connected to the rotation speed control module and rotating at a corresponding rotation speed;
    wherein the rotation speed-matching curve represents the rotation speed-matching relations of the first fan and the second fan that correspond to the optimum Air Pressure vs. Air Flow relations of the first fan and the second fan during their operations.

2. The serial fan set as claimed in claim 1, wherein the rotation speed control module is used to receive a rotation speed value of the first fan and output a rotation speed driving signal in accordance with the speed-matching relations of the rotation speed-matching curve.

3. The serial fan set as claimed in claim 1, wherein the first fan and the second fan are designed to have multiple rotation speeds.

4. A rotation speed-matching curve generation method for a serial fan set, which is composed of a first and a second fan, the method comprising:
    setting a plurality sets of rotation speed values of the first fan and the second fan;
    operating the serial fan set in accordance with the plurality sets of rotation speed values for obtaining a plurality of Air Pressure vs Air Flow curves;
    determining the local optimum value based on the Air Pressure vs Air Flow curves; and
    plotting a rotation speed-matching curve of the serial fan set by making use of the first and the second fan rotation speed values corresponding to the local optimum values.

5. The rotation speed-matching curve generation method for a serial fan set as claimed in claim 4, wherein the plurality sets of rotation speed values are obtained by adjusting the rotation speed values of the second fan based on the rotation speed values of the first fan.

6. The rotation speed-matching curve generation method for a serial fan set as claimed in claim 4, wherein the plurality sets of rotation values are obtained by adjusting the rotation speed values of the first fan based on the rotation speed values of the second fan.

7. The rotation speed-matching curve generation method for a serial fan set as claimed in claim 4, wherein the first fan and the second fan are the fans having multiple rotation speeds.

* * * * *